(12) United States Patent
An et al.

(10) Patent No.: US 12,178,077 B2
(45) Date of Patent: Dec. 24, 2024

(54) DISPLAY DEVICE HAVING DRIVING INITIALIZATION TRANSISTORS AND DIODE INITIALIZATION TRANSISTOR

(71) Applicant: Samsung Display Co., Ltd., Yongin-Si (KR)

(72) Inventors: Jun-Yong An, Asan-si (KR); Wonkyu Kwak, Seongnam-si (KR); Min Jeong Kim, Hwaseong-si (KR); Hyungjun Park, Seoul (KR); Nuree Um, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 412 days.

(21) Appl. No.: 17/672,381

(22) Filed: Feb. 15, 2022

(65) Prior Publication Data

US 2022/0336558 A1    Oct. 20, 2022

(30) Foreign Application Priority Data

Apr. 14, 2021  (KR) ........................ 10-2021-0048129

(51) Int. Cl.
*H10K 59/121*    (2023.01)
*H10K 59/131*    (2023.01)

(52) U.S. Cl.
CPC ..... *H10K 59/1213* (2023.02); *H10K 59/1216* (2023.02); *H10K 59/131* (2023.02)

(58) Field of Classification Search
CPC ............ H10K 59/1213; H10K 59/131; H10K 59/1216

See application file for complete search history.

(56) References Cited

U.S. PATENT DOCUMENTS

| 2018/0069069 A1* | 3/2018 | Ebisuno | ............... H10K 59/352 |
| 2019/0237494 A1* | 8/2019 | Bae | ......................... H10K 50/81 |

FOREIGN PATENT DOCUMENTS

| KR | 10-0729077 B1 | 6/2007 |
| KR | 10-0865603 B1 | 10/2008 |
| KR | 10-2018-0049296 A | 5/2018 |
| KR | 10-2018-0061860 A | 6/2018 |

* cited by examiner

*Primary Examiner* — Michael Jung
(74) *Attorney, Agent, or Firm* — Innovation Counsel LLP

(57) ABSTRACT

A display device may include a plurality of pixel circuits disposed adjacent to each other, the plurality of pixel circuits including a plurality of active patterns disposed to correspond to the pixel circuits, respectively. Each of the active patterns includes a first initialization channel region to which an initialization voltage is applied, a second initialization channel region to which the initialization voltage is applied, and a third initialization channel region to which the initialization voltage is applied, the second initialization channel region of each of the active patterns is connected to the first initialization channel region of the adjacent active patterns, and a first end region of the third initialization channel region is connected between the first initialization channel region and the second initialization channel region.

21 Claims, 12 Drawing Sheets

DISPLAY DEVICE HAVING DRIVING INITIALIZATION TRANSISTORS AND DIODE INITIALIZATION TRANSISTOR

CROSS-REFERENCE TO RELATED APPLICATION(S)

This application claims priority to and benefits of Korean Patent Application No. 10-2021-0048129, under 35 U.S.C. § 119, filed in the Korean Intellectual Property Office (KIPO) on Apr. 14, 2021, the entire contents of which are herein incorporated by reference.

BACKGROUND

1. Technical Field

Embodiments relate to a display device. More particularly, embodiments relate to an organic light emitting display device.

2. Description of the Related Art

The display device may display an image through pixels. To this end, the pixel may include a pixel circuit and a light emitting element. The pixel circuit may include a plurality of transistors generating a driving current and a capacitor. The light emitting element may emit light based on a driving current.

In order to form the transistors, a contact hole must be formed to connect a conductive material disposed on an upper level and a conductive material disposed on a lower level to each other. However, the contact holes may not be normally formed in the region where the contact holes are formed in a limited area. Accordingly, a signal may not be transmitted through conductive materials due to a defective contact hole.

Also, transistors of each of the pixel circuits may include an active pattern including a semiconductor material. Meanwhile, when the active patterns are electrically separated from each other, the active patterns may be damaged by static electricity introduced during a manufacturing process or use of the display device.

SUMMARY

Embodiments may provide a display device with improved display quality.

A display device according to an embodiment may include a plurality of pixel circuits disposed adjacent to each other, the plurality of pixel circuits including a plurality of active patterns disposed to correspond to the pixel circuits, respectively. Each of the active patterns includes a first initialization channel region to which an initialization voltage is applied, a second initialization channel region to which the initialization voltage is applied, and a third initialization channel region to which the initialization voltage is applied, the second initialization channel region of each of the active patterns may be connected to the first initialization channel region of the adjacent active patterns, and a first end region of the third initialization channel region is connected between the first initialization channel region and the second initialization channel region.

In an embodiment, the plurality of pixel circuits may be arranged along a plurality of pixel rows extending in a first direction and a plurality of pixel columns extending in a second direction crossing the first direction, the active patterns corresponding to one pixel row are connected to each other, and the active patterns corresponding to one pixel column are connected to each other.

In an embodiment, the each of the active patterns may further include an initialization control signal transmission line extending in one direction and disposed on the active patterns. The initialization control signal transmission line may overlap a part of the first initialization channel region, a part of the second initialization channel region, and a part of the third initialization channel region.

In an embodiment, the each of the active patterns may further include an initialization voltage transmission region connected to a second end region opposite to the first end region of the third initialization channel region.

In an embodiment, each of the active patterns may further include a driving channel region through which driving current corresponding to a data signal flows. The display device may further include a driving gate electrode disposed on the driving channel region of the active pattern to overlap the driving channel region, and applying initialization voltage.

In an embodiment, the each of the active patterns may further include a connection electrode disposed on the initialization voltage transmission region and the driving gate electrode, and connecting the initialization voltage transmission region and the driving gate electrode.

In an embodiment, the each of the active patterns may further include a capacitor electrode disposed on the driving gate electrode. A power voltage is applied to the capacitor electrode.

In an embodiment, the each of the active patterns may further include an initialization voltage transmission line extending in one direction, applying the initialization voltage, and disposed on the active patterns. The initialization voltage transmission line may overlap a part of the first initialization channel region In an embodiment, the plurality of pixel circuits may include a first pixel circuit and a second pixel circuit disposed adjacent to each other along the one direction, and the second initialization channel region of the first pixel circuit may be connected to the first initialization channel region of the second pixel circuit.

In an embodiment, the initialization voltage may be applied from the initialization voltage transmission line to the first initialization channel region of the first pixel circuit, and a second initialization channel region of the first pixel circuit may receive the initialization voltage from the first initialization channel region of the second pixel circuit.

In an embodiment, the each of the plurality of pixel circuits may further include a connection electrode disposed on the initialization voltage transmission line. The connection electrode may connect the initialization voltage transmission line and the first initialization channel region of the active pattern.

A display device according to an embodiment a first pixel circuit, and a second pixel circuit disposed adjacent to the first pixel circuit along a first direction and connected to the first pixel circuit. The first pixel circuit may include a first active pattern, the first active pattern including a first initialization channel region to which an initialization voltage is applied, and a second initialization channel region to which the initialization voltage is applied, the second circuit may include a second active pattern, the second active pattern including a third initialization channel region to which the initialization voltage is applied and a fourth initialization channel region to which the initialization voltage is applied, and the third initialization channel region may be connected to the second initialization channel region, and the initialization voltage is transferred from the third initialization channel region to the second initialization channel region.

In an embodiment, the display device may further include a third pixel circuit disposed adjacent to the first pixel circuit along a second direction crossing to the first direction and electrically connected to the first pixel circuit. The third pixel circuit may include a third active pattern connected to the first active pattern.

In an embodiment, the each of the first pixel circuit and the second pixel circuit may further include an initialization control signal transmission line extending in the first direction, applying a gate signal, and disposed on the first active pattern and the second active pattern. The initialization control signal transmission line may overlap the first to third initialization channel regions.

In an embodiment, the first active pattern may include a fifth initialization channel region connected between the first initialization channel region and the second initialization channel region, and a first initialization voltage transmission region connected to the fifth initialization channel region, the second active pattern may include a sixth initialization channel region connected between the third initialization channel region and the fourth initialization channel region, and a second initialization voltage transmission region connected to the sixth initialization channel region, and the initialization control signal transmission line may overlap a part of the fifth initialization channel region and a part of the sixth initialization channel region.

In an embodiment, the first active pattern may include a first driving channel region through which driving current corresponding to a first data signal flows and the second active pattern includes a second driving channel region through which driving current corresponding to a second data signal flows, and the display device may further include a first driving gate electrode disposed on the first driving channel region, overlapping the first driving channel region, and applying the initialization voltage, and a second driving gate electrode disposed on the second driving channel region, overlapping the second driving channel region, and applying the initialization voltage.

In an embodiment, the each of the first pixel circuit and the second pixel circuit may further include a first connection electrode disposed on the first initialization voltage transmission region and the first driving gate electrode, and connecting the first initialization voltage transmission region and the first driving gate electrode, and a second connection electrode disposed on the second initialization voltage transmission region and the second driving gate electrode, and connecting the second initialization voltage transmission region and the second driving gate electrode In an embodiment, the each of the first pixel circuit and the second pixel circuit may further include a capacitor electrode disposed on the each of first driving gate electrode and the second driving gate electrode and applying a power voltage.

In an embodiment, the display device may further include an initialization voltage transmission line extending along a first direction, applying the initialization voltage, and disposed on the first active pattern and the second active pattern. The initialization voltage transmission line may overlap a part of the first initialization channel region and a part of the third initialization channel region In an embodiment, the initialization voltage may be applied to the first initialization channel region from the initialization voltage transmission line, and the second initialization channel region may transfer the initialization voltage from the third initialization channel region In an embodiment, the each of the first pixel circuit and the second pixel circuit may further include a first connection electrode disposed on the initialization voltage transmission line and connecting the initialization voltage transmission line and the first initialization channel region and a second connection electrode disposed on the initialization voltage transmission line and connecting the initialization voltage transmission line and the third initialization channel region.

In the display device according to the embodiments of the present inventive concept, an active pattern of one pixel may be connected to an active pattern of an adjacent pixel. Accordingly, the one pixel may receive an electrical signal (e.g., an initialization voltage, etc.) from the adjacent pixel, and thus, even when the signal is not normally transmitted due to poor contact hole formation in one pixel, the one pixel may be normally driven by receiving the signal from the adjacent pixel.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Hereinafter, display devices in accordance with embodiments will be explained in detail with reference to the accompanying drawings.

Figure 1:
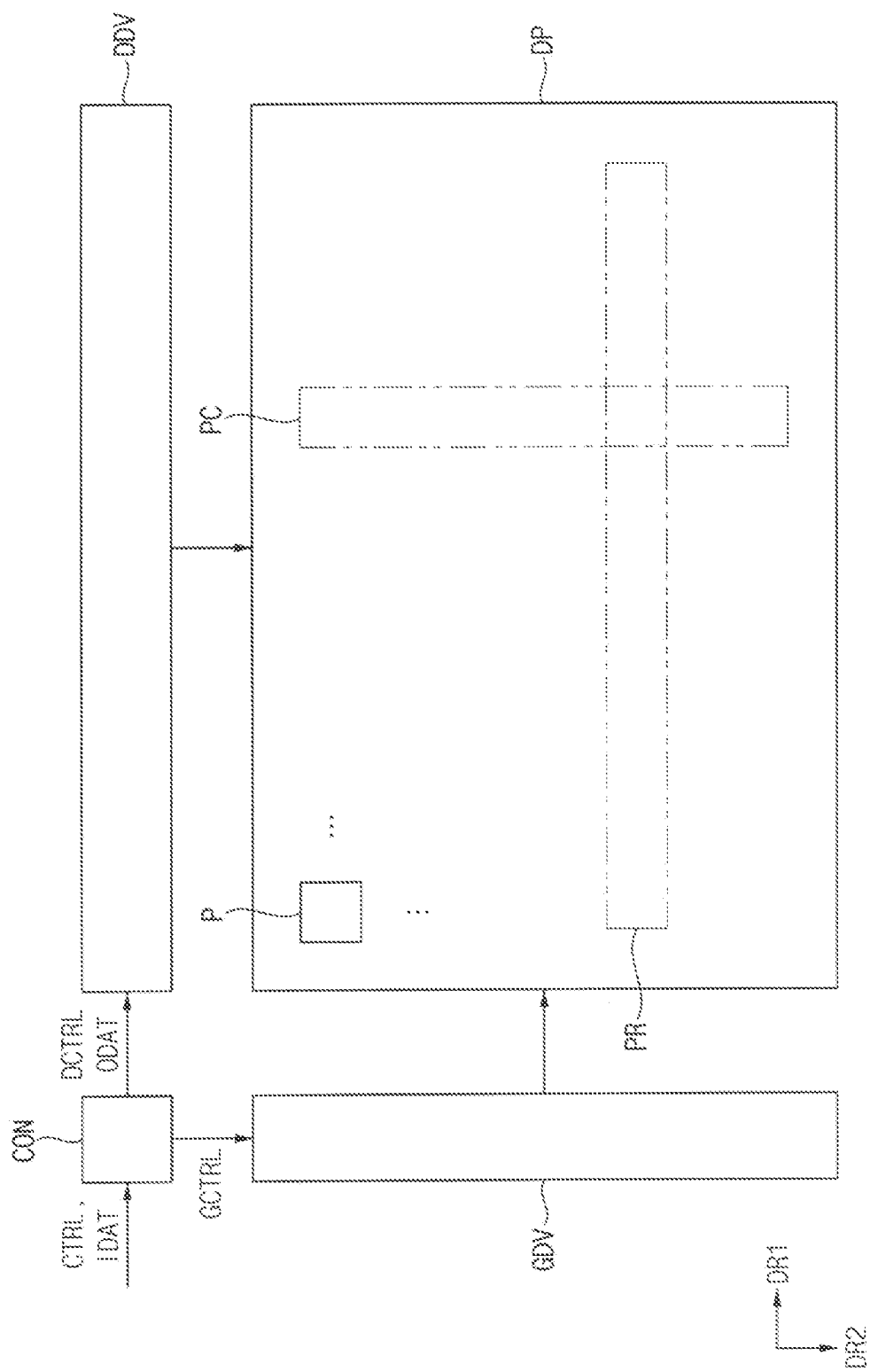
FIG. 1 is a block view illustrating a display device according to an embodiment.

FIG. 1 is a block view illustrating a display device according to an embodiment.

Referring to FIG. 1, The display device may include a display panel DP, a data driver DDV, a gate driver GDV, and a timing controller CON.

The display device may display an image through the display panel DP. To this end, the display panel DP may include a plurality of pixels P. Each of the plurality of pixels P may include a pixel circuit and a light emitting element connected to the pixel circuit. In some embodiments, the display panel DP may be configured as a single panel. Alternatively, in embodiments, the display panel DP may include a plurality of panels.

The timing controller CON may generate a gate control signal GCTRL, a data control signal DCTRL, and an output image data ODAT in response to a control signal CTRL and an input image data IDAT provided from an outside. For example, the control signal CTRL may include a vertical synchronization signal, a horizontal synchronization signal, an input data enable signal, a master clock signal, and the like. For example, the input image data IDAT may be RGB data including red image data, green image data, and blue image data. Alternatively, the input image data IDAT may include magenta image data, cyan image data, and yellow image data.

The gate driver GDV may generate gate signals in response to the gate control signal GCTRL provided from the timing controller CON. For example, the gate control signal GCTRL may include a vertical start signal, a clock signal, and the like. In embodiments, the gate driver GDV may be a gate driver integrated chip IC and the gate driver IC may be connected to the display panel DP. The gate driver GDV may be electrically connected to the display panel DP and sequentially output the gate signals. Each of the pixels P may receive a data signal according to control of each of the gate signals.

The data driver DDV may generate the data signal in response to the data control signal DCTRL and the output image data ODAT provided from the timing controller CON. For example, the data control signal DCTRL may include an output data enable signal, a horizontal start signal, a load signal, and the like. In embodiments, the data driver DDV may be a data driver IC and the data driver IC may be electrically connected to the display panel DP. The data driver DDV may be electrically connected to the display panel DP and may generate a plurality of data signals. Each of the pixels P may display an image with a luminance corresponding to each of the data signals.

In embodiments, the pixels P may be arranged in a first direction DR1 and a second direction DR2 crossing to the first direction. That is, the pixels P may be arranged in a matrix form. Accordingly, the pixels may include a plurality of pixel rows PR extending in the first direction DR1 and a plurality of pixel columns PC extending in the second direction DR2. Although it is illustrated that the pixels P are arranged in a matrix form in FIG. 1, this is exemplary and the arrangement of the pixels P is not limited thereto.

Figure 2:
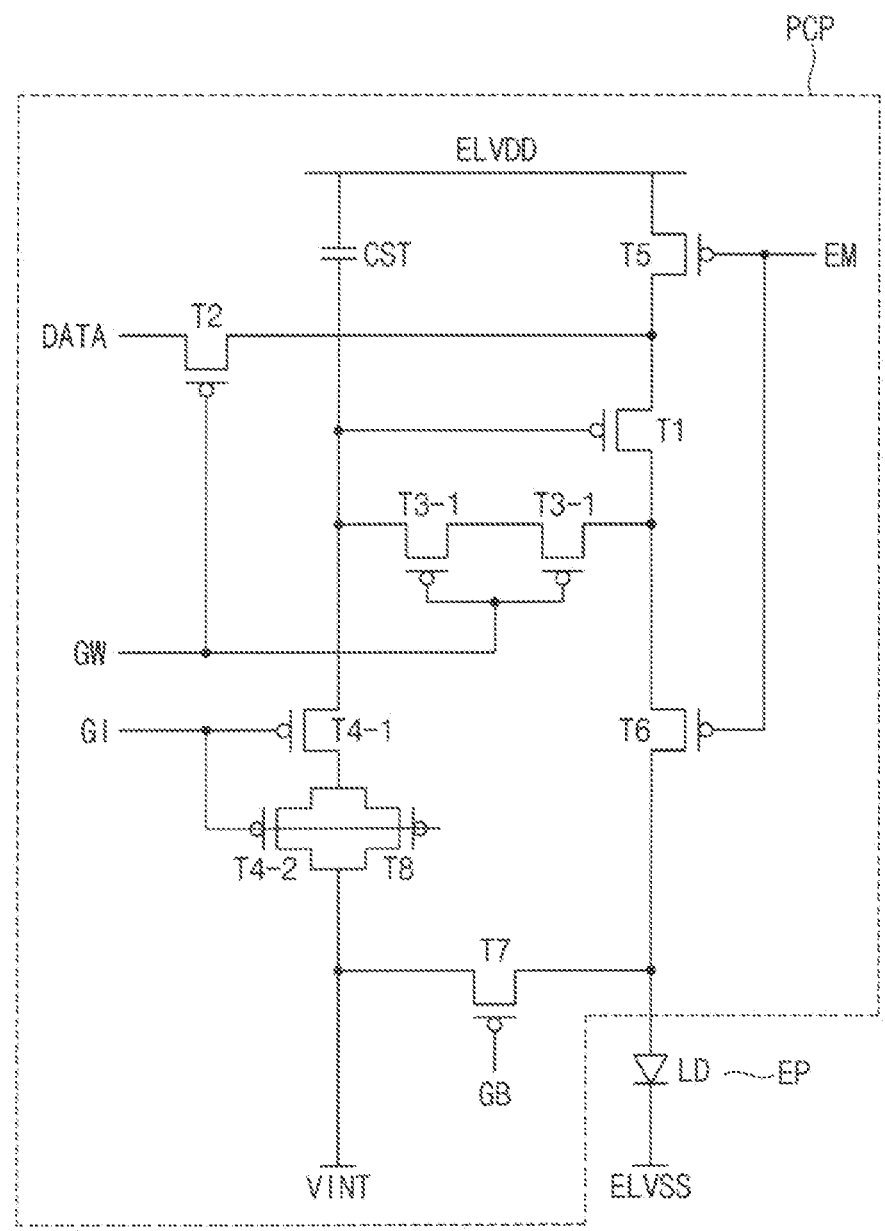
FIG. 2 is a circuit view illustrating one pixel included in the display device of FIG. 1.

FIG. 2 is a circuit view illustrating one pixel included in the display device of FIG. 1.

Referring to FIG. 2, Each of the pixels P may include a pixel circuit PCP and a light emitting part EP. The pixel circuit PCP may include a plurality of transistors T1, T2, T3-1, T3-2, T4-1, T4-2, T5, T6, T7, T8 and a storage capacitor CST. The light emitting part EP may include a light emitting element LD. The transistors T1, T2, T3-1, T3-2, T4-1, T4-2, T5, T6, T7, T8 may include the first transistor T1, the second transistor T2, the third transistor T3-1, T3-2, the fourth transistors T4-1, T4-2, the fifth transistor T5, the sixth transistor T6, the seventh transistor T7, and the eighth transistor T8.

The first transistor T1 may be electrically connected to a first power voltage ELVDD and a first electrode of the light emitting element LD, and may provide a driving current corresponding to the data signal DATA to the light emitting element LD. In other words, the first transistor T1 may be a driving transistor.

The second transistor T2 may be connected to a first electrode of the first transistor T1 and may provide the data signal DATA in response to a data control signal GW to the first electrode of the first transistor T1. In other words, the second transistor T2 may be a switching transistor.

The third transistors T3-1, T3-2 may be connected between a gate electrode and a second electrode of the first transistor T1 and may compensate a threshold voltage of the first transistor T1 by diode-connecting the first transistor T1 in response to the data control signal GW. In other words, the third transistors T3-1, T3-2 may be compensation transistors.

In embodiments, the third transistors T3-1, T3-2 may include a first compensation transistor T3-1 and a second compensation transistor T3-2. The first compensation transistor T3-1 and the second compensation transistor T3-2 may be connected in series with each other. In other words, a gate electrode of the first compensation transistor T3-1 and a gate electrode of the second compensation transistor T3-2 are connected to each other, and a second electrode of the first compensation transistor T3-1 and a first electrodes of the second compensation transistor T3-2 may be connected to each other.

The fourth transistors T4-1, T4-2 may be connected to the gate electrode of the first transistor T1 and may provide an initialization voltage VINT to the gate electrode of the first transistor T1 in response to an initialization control signal GI. In other words, the fourth transistors T4-1, T4-2 may be driving initialization transistors.

In embodiments, the fourth transistors T4-1, T4-2 may include a first driving initialization transistor T4-1 and a second driving initialization transistor T4-2. The first driving initialization transistor T4-1 and the second driving initialization transistor T4-2 may be connected in series with each other. In other words, a gate electrode of the first driving initialization transistor T4-1 and a gate electrode of the second driving initialization transistor T4-2 may be connected to each other. A second electrode of the first driving initialization transistor T4-1 and a first electrode of the second driving initialization transistor T4-2 may be connected to each other.

The fifth transistor T5 may be connected between a first power supply voltage ELVDD and the first electrode of the first transistor T1, and the sixth transistor T6 may be connected between the second electrode of the first transistor T1 and the first electrode of the light emitting element LD. Each of the fifth transistor T5 and the sixth transistor T6 may provide the driving current corresponding to the data signal DATA to the first electrode of the light emitting element LD in response to a light emitting control signal EM. In other words, each of the fifth transistor T5 and the sixth transistor T6 may be a light emitting control transistor.

The seventh transistor T7 may be connected between an initialization voltage VINT and the first electrode of the light emitting element LD and may provide the initialization voltage VINT to the first electrode of the light emitting element LD in response to a diode initialization control signal GB. In other words, the seventh transistor T7 may be a diode initialization transistor.

The eighth transistor T8 may be connected to the gate electrode of the first transistor T1, and may provide the initialization voltage VINT to the gate electrode of the first transistor T1 in response to the initialization control signal GI. In other words, the eighth transistor T8 may be a driving initialization transistor. The eighth transistor T8 may provide the initialization voltage VINT together with the fourth transistors T4-1, T4-2 to the gate electrode of the first transistor T1, thereby display performance of the display device may be improved. For example, even when one of the transistors T4-2 and T8 does not operate, the remaining transistor may provide the initialization voltage VINT to the gate electrode of the first transistor T1.

The light emitting part EP may be disposed in various ways. For example, the light emitting part EP may include light emitting elements LD that emit red, green, and blue are sequentially arranged. The light emitting part EP may be arranged in a PENTILE™ manner in which light emitting elements LD emitting green, blue, green, and red are sequentially arranged. In addition, the light emitting devices LD may include one red light emitting element, one blue light emitting element and two green light emitting elements arranged in a DIAMOND PIXEL™ shape. In addition, in the light emitting part EP, the light emitting elements LD may be disposed in an S-stripe manner.

FIGS. 3 to 9 are layout views illustrating pixels included in the display device of FIG. 1.

Figure 3:
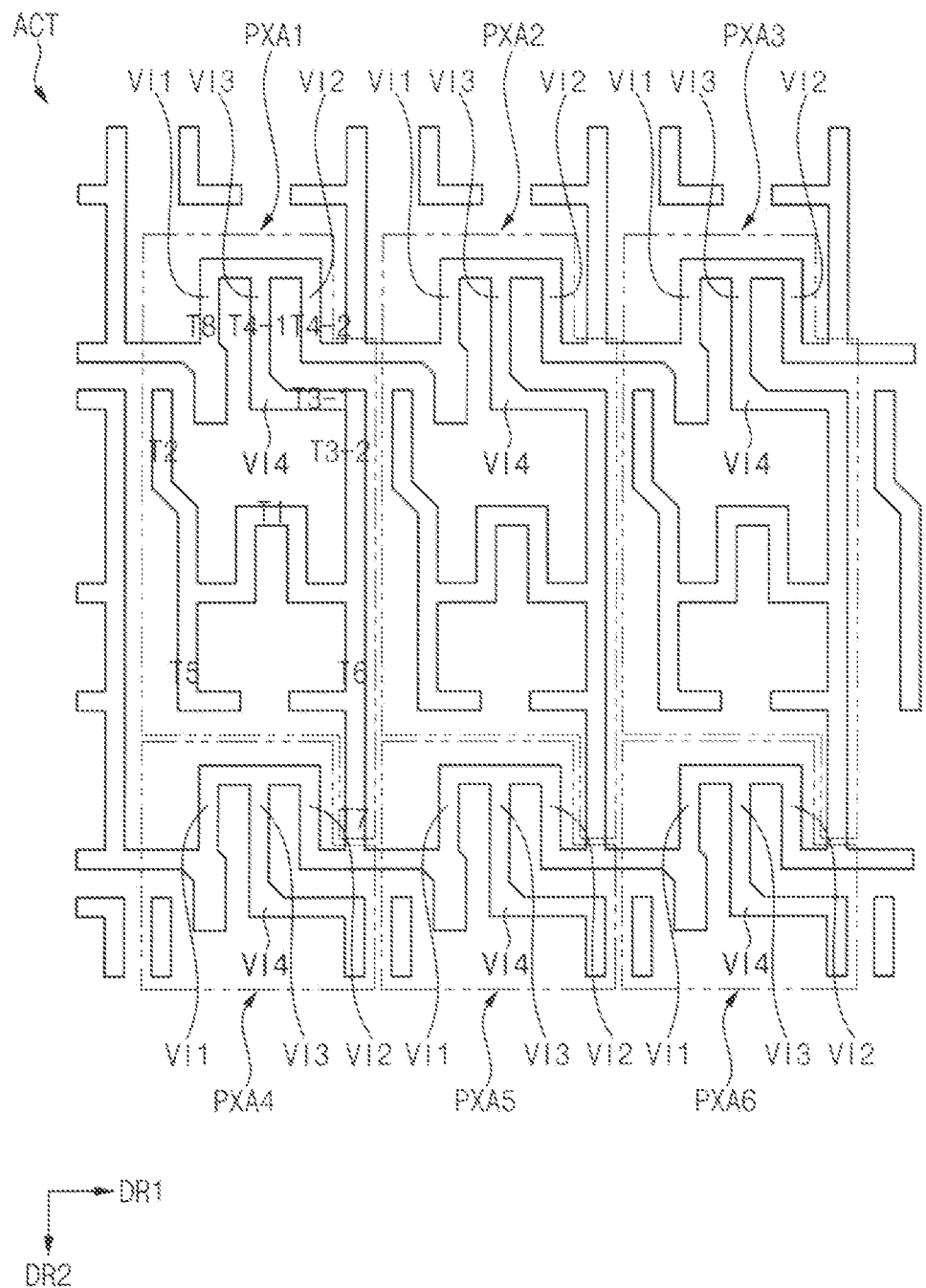
FIGS. 3, 4, 5, 6, 7, 8 and 9 are layout views illustrating pixels included in the display device of FIG. 1.
Figure 4:
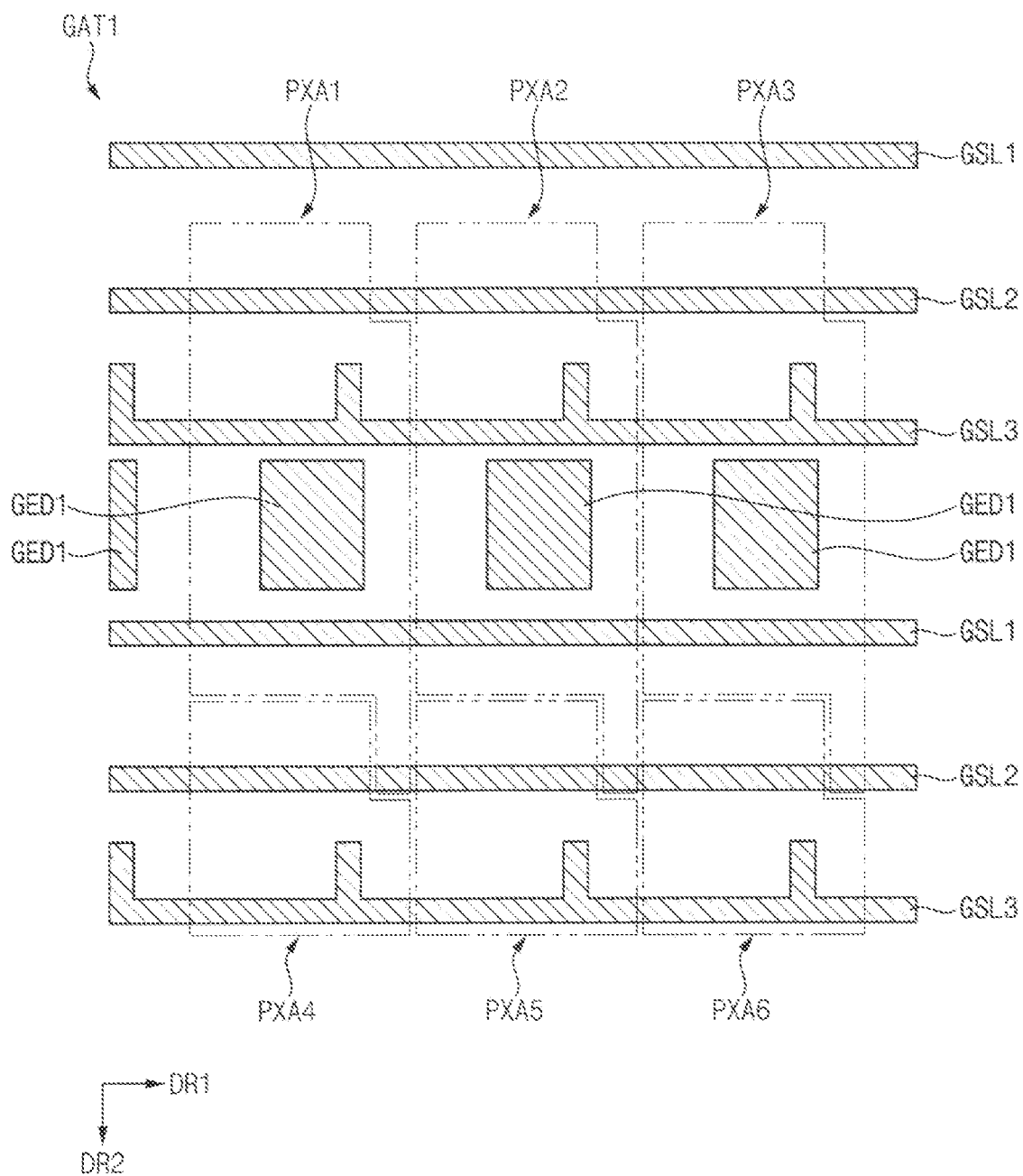
Figure 5:
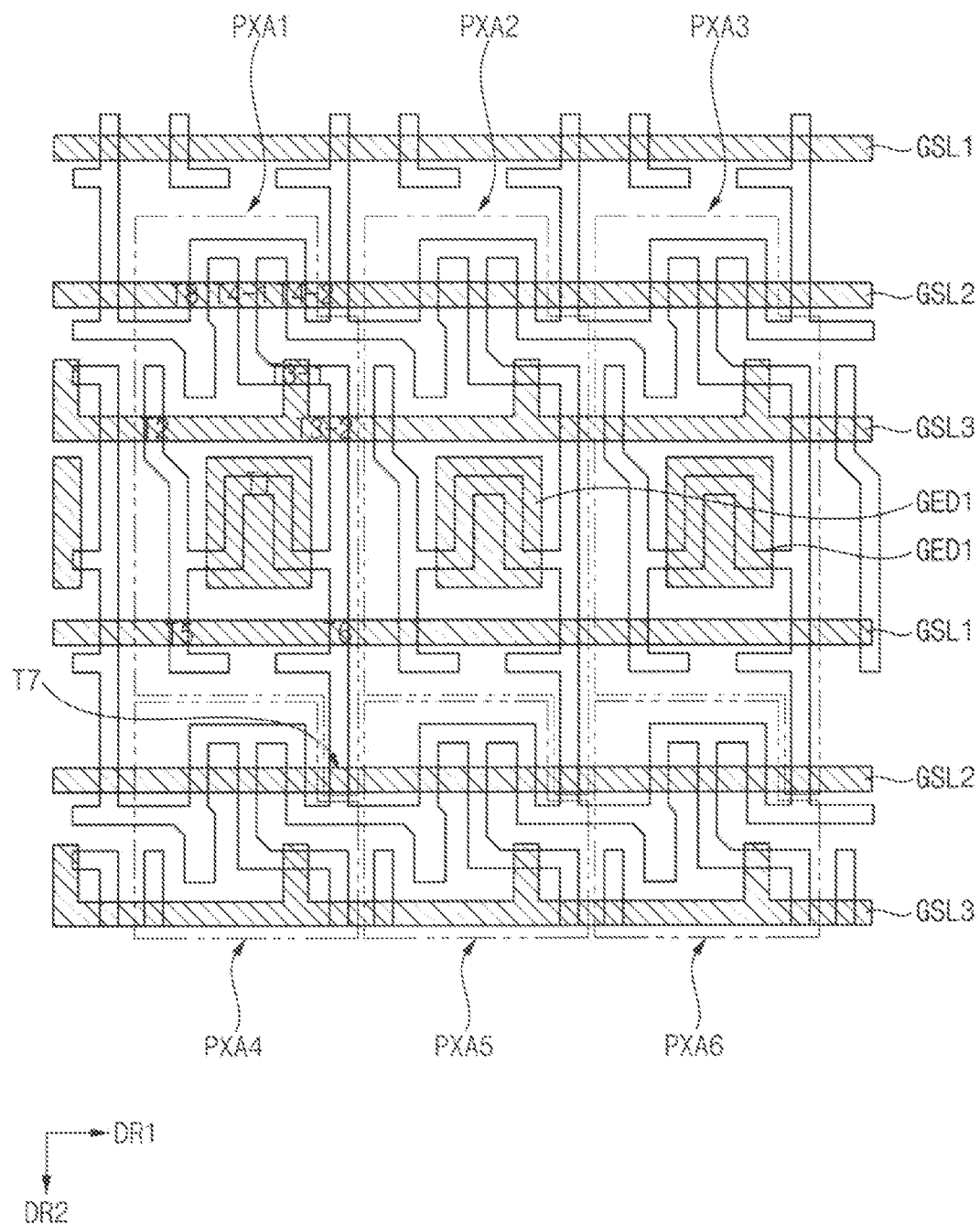

Referring to FIGS. 1, 2 and 3, the display device may include an active layer ACT. The active layer ACT may include active patterns. The active patterns may be connected to form the active layer ACT. The active patterns may be respectively disposed to correspond to the pixel circuit regions PXA1, PXA2, PXA3, PXA4, PXA5, PXA6. Each of the active patterns may be included in the pixel circuits PCP. The pixel circuits PCP may be disposed to correspond to the pixel circuit regions PXA1, PXA2, PXA3, PXA4, PXA5, PXA6. For example, a first pixel circuit may be disposed in the first pixel circuit region PXA1 and the second pixel circuit may be disposed adjacent to the first pixel along the first direction DR1. In addition, a third pixel circuit may be disposed adjacent to the first pixel circuit along the second direction DR2.

The active layer ACT may include a semiconductor material. For example, the active layer ACT may include an oxide-based semiconductor material or a silicon-based semiconductor material.

Each of the active patterns may include a first initialization channel region VI1, a second initialization channel region VI2, a third initialization channel region VI3, and an initialization voltage transmission region VI4. The initialization voltage VINT may be applied to the first initialization channel region VI1, the second initialization channel region VI2, the third initialization channel region VI3, and the initialization voltage transfer region VI4. In embodiments, the second initialization channel region VI2 of the active pattern disposed in the first pixel circuit region PXA1 may receive the initialization voltage VINT from the first initialization channel region VI1 of an active pattern disposed in the second pixel circuit region PXA2. To this end, the second initialization channel region VI2 of the active pattern disposed in the first pixel circuit region PXA1 may be connected to the first initialization channel region VI2 of the active pattern disposed in the second pixel circuit region PXA2. For example, the second initialization channel region VI2 of the active pattern disposed in the first pixel circuit region PXA1 may be directly connected to the first initialization channel region VI2 of the active pattern disposed in the second pixel circuit region PXA2.

Active patterns disposed in the pixel circuit regions PXA1, PXA2, PXA3, PXA4, PXA5, PXA6 may be connected to each other. That is, the active patterns may be connected to each other in the first direction DR1 and the second direction DR2. Accordingly, the active layer ACT may have a mesh structure.

As the active patterns are connected to each other in the first direction DR1 and the second direction DR2, charges applied to a portion of the active pattern are distributed in the first direction DR1 and the second direction DR2. Accordingly, the display device may prevent defects caused by static electricity.

The third initialization channel region VI3 may be disposed between the first initialization channel region VI1 and the second initialization channel region VI2 in a plan view. The initialization voltage VINT applied to the first initialization channel region VI1 may be transferred to the third initialization channel region VI3 through the active pattern. The initialization voltage VINT applied to the second initialization channel region VI2 may be transferred to the third initialization channel region VI3 through the active pattern.

A first end region of the initialization voltage transmission region VI4 may be connected to the third initialization channel region VI3. For example, the first end region of the initialization voltage transmission region VI4 may be directly connected to the third initialization channel region VI3. A second end region of the initialization voltage transmission region VI4 may be electrically connected to a second connection electrode BE2 to be described later.

Although the active layer ACT is illustrated as including six active patterns in FIG. 3, the active layer ACT may include more an active pattern connected in the first direction DR1 and/or the second direction DR2.

Referring to FIGS. 1, 2, 3 and 4, the display device may further include a first conductive layer GAT1. The first conductive layer GAT1 may be disposed on the active layer ACT. An insulating layer may be disposed between the first conductive layer GAT1 and the active layer ACT. The insulating layer may include silicon oxide, silicon nitride, silicon oxynitride, or the like.

The first conductive layer GAT1 may include a light emitting control signal transmission line GSL1, an initialization control signal transmission line GSL2, a data control signal transmission line GSL3, and a plurality of gate electrodes GED1.

The light emitting control signal EM may be applied to the light emitting control signal transmission line GSL1, the initialization control signal GI or the diode initialization control signal GB may be applied to the initialization control signal transmission line GSL2, and the data control signal GW may be applied to the data control signal transmission line GSL3, and the gate electrodes GED1 may be connected to the initialization voltage transfer region VI4 of the active layer ACT by a second connection electrode BE2 to be described later.

Referring to FIGS. 1, 2, 3, 4 and 5, the first conductive layer GAT1 and the active layer ACT may partially overlap. Portions where the first conductive layer GAT1 and the active layer ACT overlap may constitute transistors. That is, each of the overlapped portions of the active layer ACT may constitute a channel region, and adjacent regions of the channel region may constitute a source region and a drain region of the transistor. Regions in which the transistors T1, T2, T3-1, T3-2, T4-1, T4-2, T5, T6, T7, T8 are disposed in the first pixel circuit region PXA1 are illustrated as an example in FIG. 5. This may be the same in the other pixel circuit regions PXA2, PXA3, PXA4, PXA5, PXA6.

The initialization control signal transmission line GSL2 may extend in the first direction DR1. The initialization control signal transmission line GSL2 may overlap the first initialization channel region VI1, the second initialization channel region VI2, and the third initialization channel region VI3. Accordingly, the first initialization channel region VI1 may constitute the eighth transistor T8 together with the initialization control signal transmission line GSL2, the second initialization channel region VI2 may constitute the second driving initialization transistor T4-2 together with the initialization control signal transmission line GSL2, and the third initialization channel region VI3 may constitute the first driving initialization transistor T4-1 together with the initialization control signal transmission line GSL2.

The data control signal transmission line GSL3 may extend in the first direction DR1. Parts of the data control signal transmission line GSL3 overlapping the active pattern may constitute the second transistor T2, the first compensation transistor T3-1, and the second compensation transistor T3-2, respectively.

Parts of the light emitting control signal transmission line GSL1 overlapping the active pattern may constitute the fifth transistor T5 and the sixth transistor T6, respectively.

A part where the driving gate electrode GED1 overlaps the active pattern may constitute the first transistor T1. A part in which the active pattern overlaps the driving gate electrode GED1 may be a driving channel region through which driving current corresponding to the data signal DATA flows to the light emitting element LD.

Figure 6:
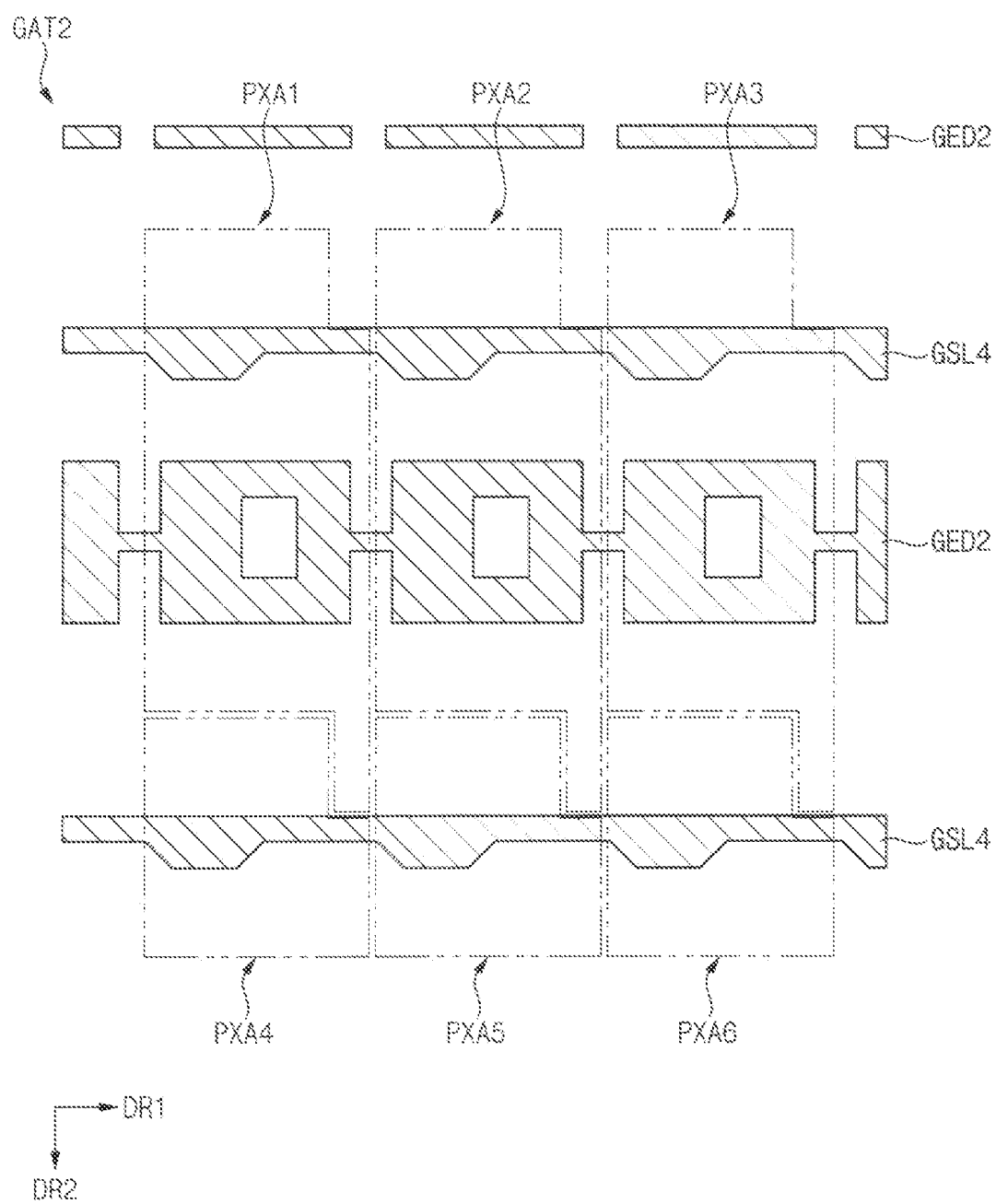
Figure 7:
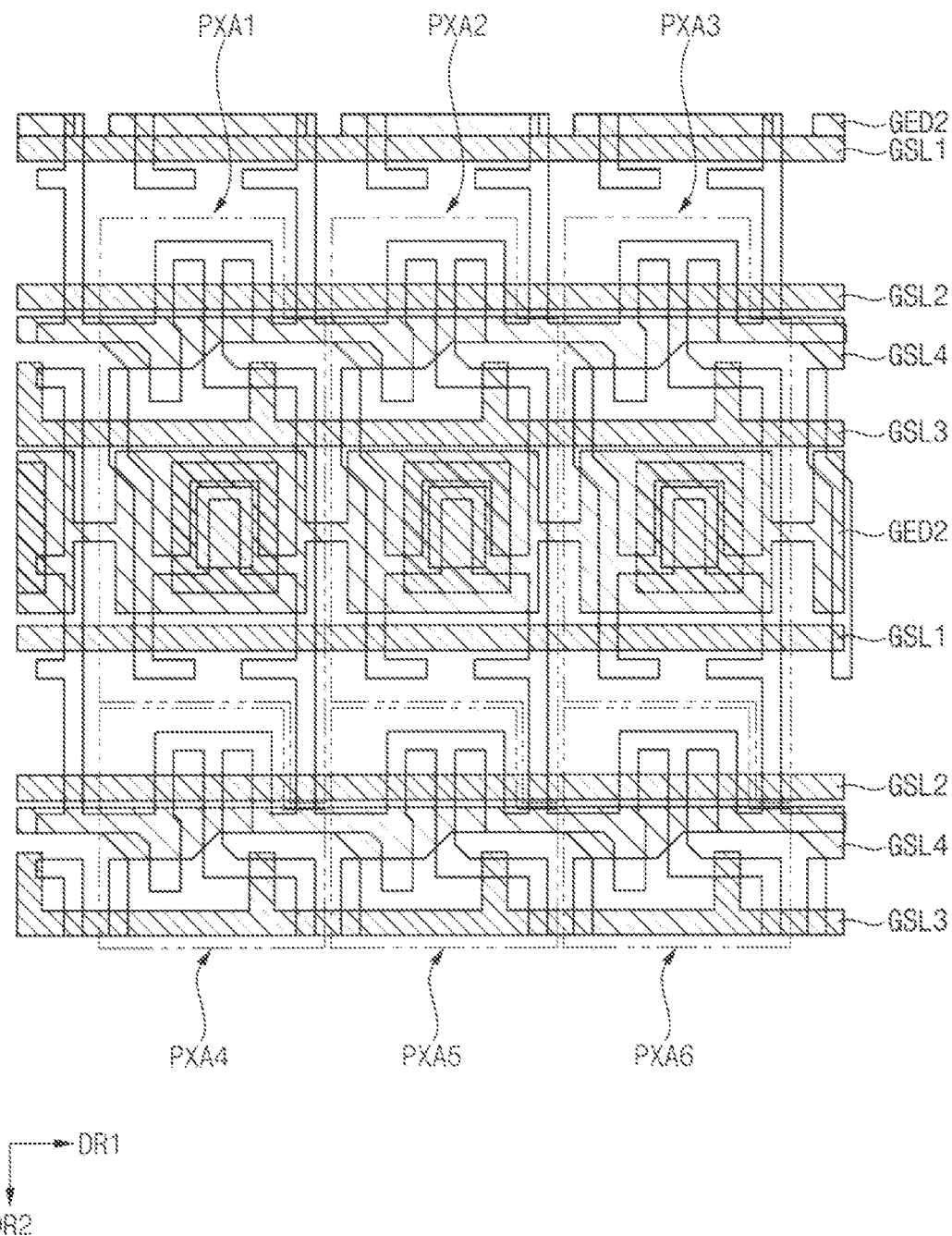

Referring to FIGS. 1, 2 and 6, the display device may further include a second conductive layer GAT2. The second conductive layer GAT2 may be disposed on the first conductive layer GAT1. An insulating layer may be disposed between the second conductive layer GAT2 and the first conductive layer GAT1.

The second conductive layer GAT2 may include a capacitor electrode GED2 and an initialization voltage transmission line GSL4. The first voltage ELVDD may be applied to the capacitor electrode GED2, and the initialization voltage VINT may be applied to the initialization voltage transmission line GSL4.

Referring to FIGS. 1, 2, 3, 4, 5, 6 and 7, the capacitor electrode GED2 may be disposed to overlap the driving gate electrode GED1. Accordingly, the capacitor electrode GED2 may constitute the storage capacitor CST together with the driving gate electrode GED1.

The initialization voltage transmission line GSL4 may extend in the first direction DR1. The initialization voltage transmission line GSL4 may overlap the first initialization channel region VI1.

Figure 8:
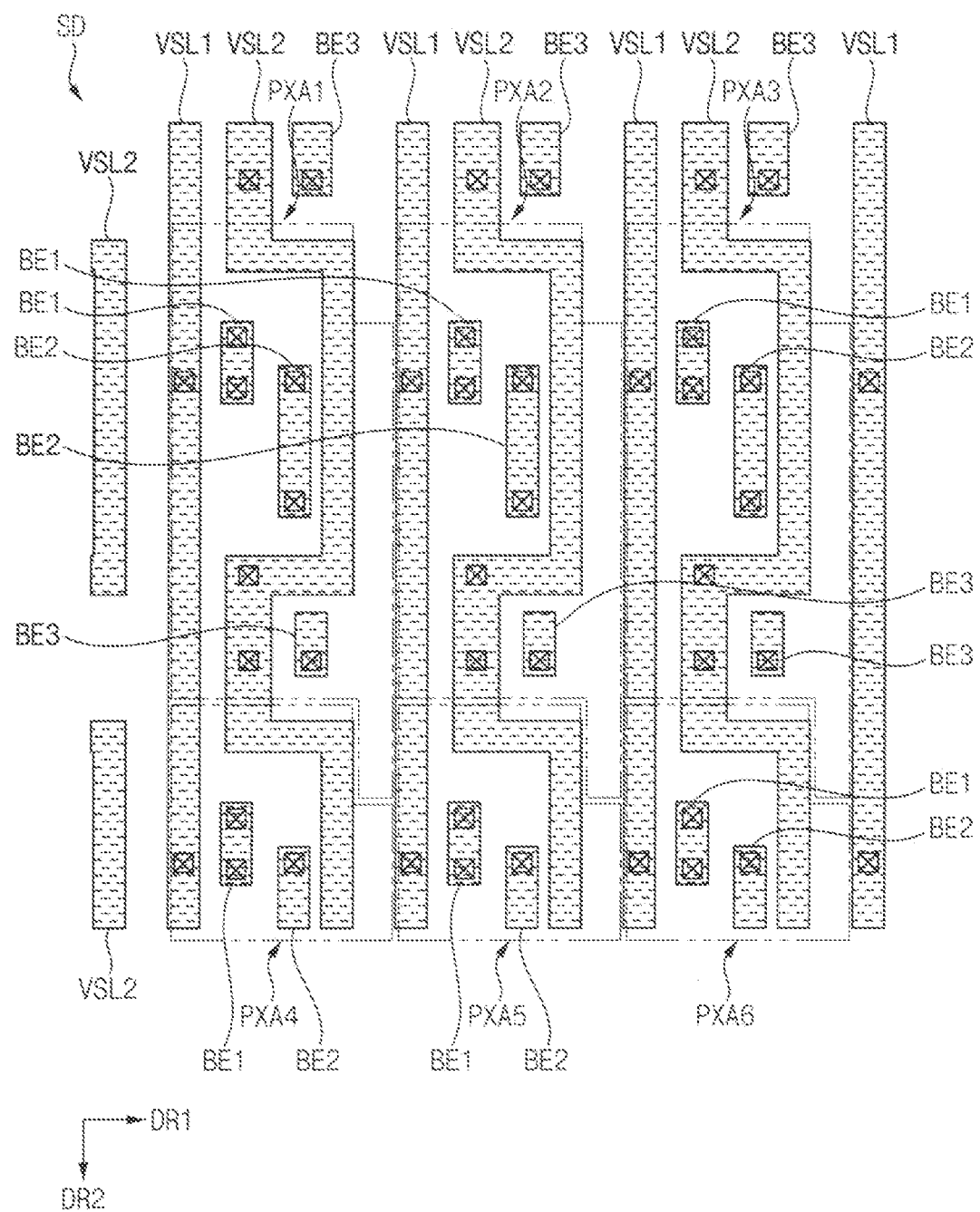

Referring to FIGS. 1, 2, and 8, the display device may further include a third conductive layer SD. The third conductive layer SD may be disposed on the second conductive layer GAT2. The insulating layer may be disposed between the third conductive layer SD and the second conductive layer GAT2.

The third conductive layer SD may include a data transmission line VSL1, a power voltage transmission line VSL2, a first connection electrode BE1, a second connection electrode BE2, and a third connection electrode BE3.

The data signal DATA may be applied to the data transmission line VSL1, and the first power voltage ELVDD may be applied to the power voltage transmission line VSL2.

Referring to FIGS. 1, 2, 3, 4, 5, 6, 7 and 8, the first connection electrode BE1 may connect the active layer ACT and the initialization voltage transmission line GSL4 to each other. In embodiments, the first connection electrode BE1 may electrically connect the initialization voltage transmission line GSL4 and the first initialization channel region VI1 of the active pattern. The first connection electrode BE1 may be connected to the first initialization channel region VI1 and the initialization voltage transmission line GSL4 through contact holes exposing the first initialization channel region VI1 and the initialization voltage transmission line GSL4, respectively. Through this, the initialization voltage VINT applied through the initialization voltage transmission line GSL4 may be applied to the first initialization channel region VI1 of the active pattern through the first connection electrode BEL Thereafter, the initialization voltage VINT may be transferred to the second initialization channel region VI2 of an adjacent active pattern. Also, the initialization voltage VINT may be transferred to the initialization voltage transmission region VI3.

The second connection electrode BE2 may transfer the initialization voltage VINT transmitted from the initialization voltage transmission region VI3 to the driving gate electrode GED1. The second connection electrode BE2 may electrically connect the active layer ACT and the driving gate electrode GED1. To this end, the second connection electrode may be connected to the active layer ACT and the driving gate electrode GED1 through contact holes exposing the active layer ACT and the driving gate electrode GED1, respectively.

The third connection electrode BE3 may be connected to the light emitting element LD. The third connection electrode BE3 may be connected to the sixth transistor T6 and may apply the first power voltage ELVDD transmitted from the sixth transistor T6 to the anode electrode of the light emitting element LD for a predetermined time. That is, the third connection electrode BE3 may be connected to the anode electrode of the light emitting element LD through a separate contact hole formed in an insulating layer disposed above the third connection electrode BE3.

Figure 9:
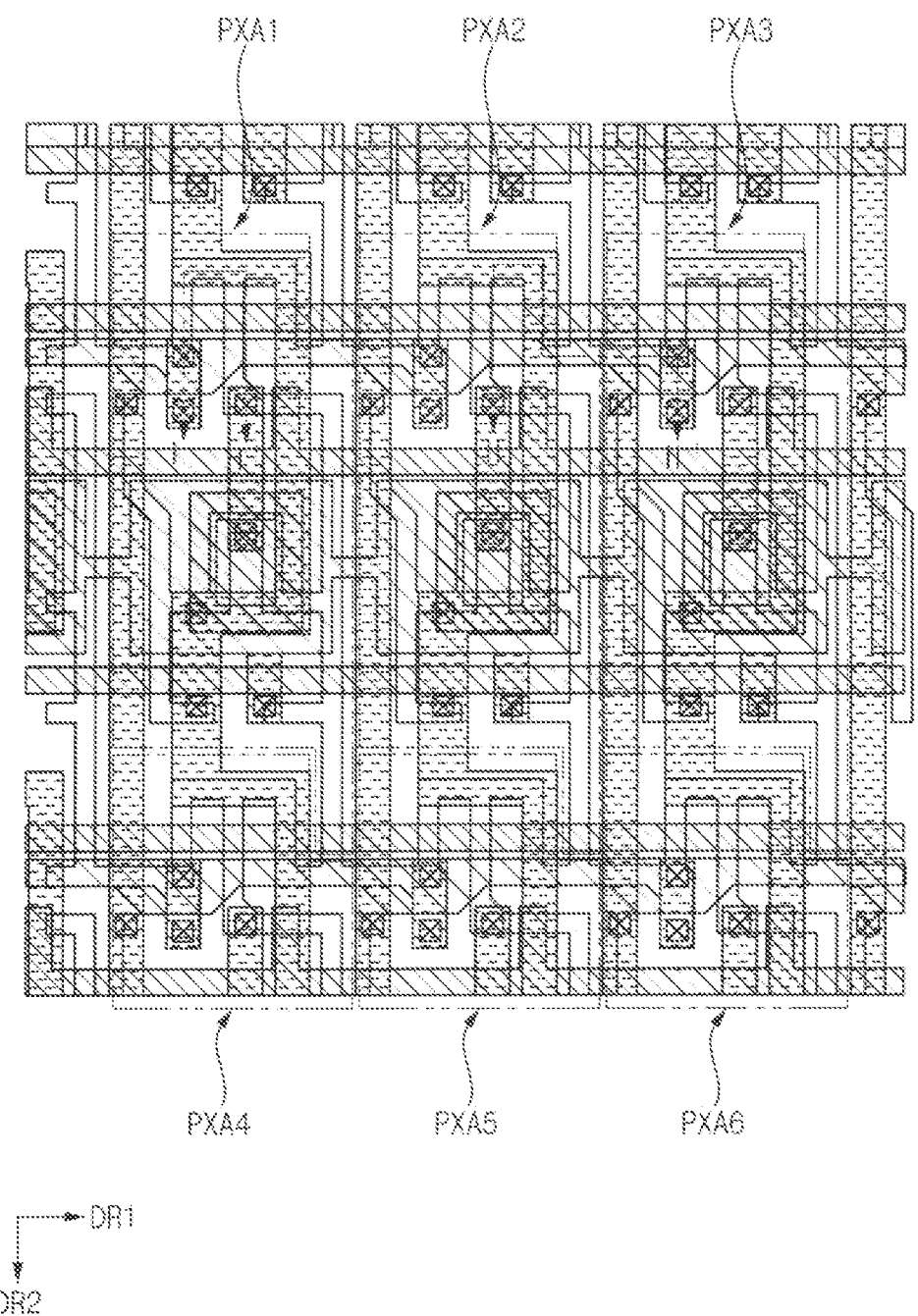
Figure 10:
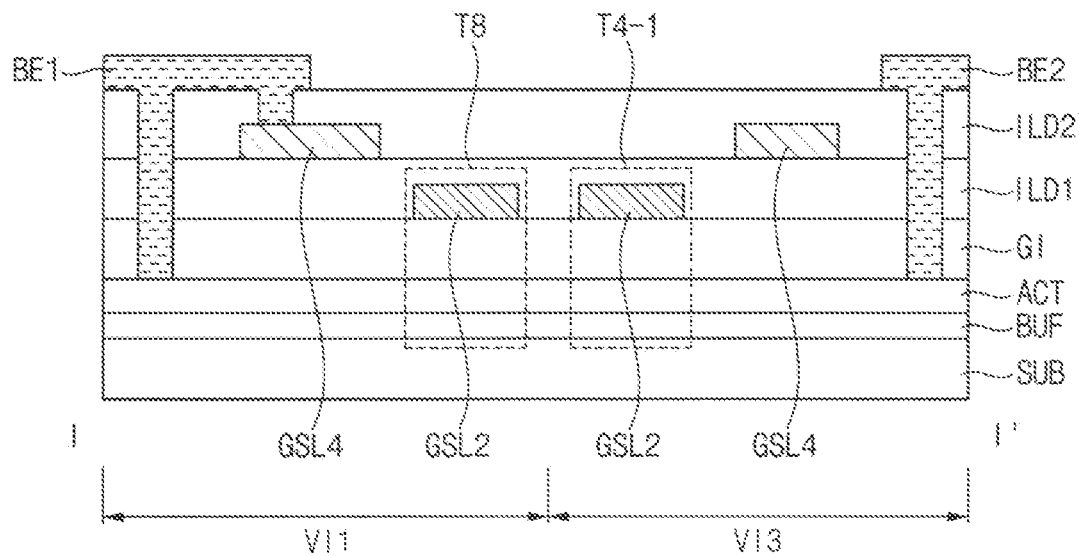
FIG. 10 is a cross-sectional view illustrating a cross-section taken along line I-I' of FIG. 9.

FIG. 10 is a cross-sectional view illustrating a cross-section taken along line I-I' of FIG. 9. FIG. 10 may be a first initialization channel region VI1 and a second initialization channel region VI2 included in one pixel circuit region.

Referring to FIGS. 9 and 10, the display device may include a substrate SUB, a buffer layer BUF, an active layer ACT, a gate insulating layer GI, an initialization control signal transmission line GSL2, and a first interlayer insulating layer ILD1, an initialization voltage transmission line GSL4, a second interlayer insulating layer ILD2, a first connection electrode BE1, and a second connection electrode BE2.

The substrate SUB may be formed of a transparent or opaque material. For example, the substrate SUB may be a quartz substrate, a synthetic quartz substrate, a calcium fluoride substrate, a fluorine-doped quartz substrate, a sodalime glass substrate, or a non-alkali glass substrate and the like. Optionally, the substrate SUB may include a flexible transparent resin substrate. For example, the transparent resin substrate may be a polyimide substrate.

The buffer layer BUF may be disposed on the substrate SUB. The buffer layer BUF may prevent diffusion of metal atoms or impurities from the substrate SUB to the active layer ACT. In addition, the buffer layer BUF may control a heat transfer rate in a crystallization process for forming the active layer ACT to obtain a substantially uniform active layer ACT.

The active layer ACT may be disposed on the buffer layer BUF. In embodiments, the active layer ACT may include polycrystalline silicon. In embodiments, the active layer ACT may include an oxide semiconductor. For example, the oxide semiconductor may include at least one oxide selected from indium ("In"), gallium ("Ga"), tin ("Sn"), zirconium ("Zr"), vanadium ("V"), hafnium ("Hf"), cadmium ("Cd"), germanium ("Ge"), chromium of (Cr), titanium (Ti), and zinc ("Zn").

The active layer ACT may include a plurality of active patterns, and the active patterns may be disposed to respectively correspond to a plurality of pixel circuit regions. For example, the active patterns may be disposed to correspond to the pixel circuit regions PXA1, PXA2, PXA3, PXA4, PXA5, PXA6 of FIG. 3.

The gate insulating layer GI may be disposed to cover the active layer ACT. The gate insulating layer GI may include a silicon compound, a metal oxide, or the like.

The initialization control signal transmission line GSL2 may be disposed on the gate insulating layer GI. Regions where the initialization control signal transmission line GSL2 overlaps the active layer ACT may constitute transistors T4-1 and T8, respectively.

The first interlayer insulating layer ILD1 may cover the second initialization control signal transmission line GSL2 and may be disposed on the gate insulating layer GI. The first interlayer insulating layer ILD1 may include a silicon compound, a metal oxide, or the like.

The initialization voltage transmission line GSL4 may be disposed on the first interlayer insulating layer ILD1. The initialization voltage VINT of FIG. 2 may be applied to the initialization voltage transmission line GSL4.

The second interlayer insulating layer ILD2 may cover the initialization voltage transmission line GSL4 and may be disposed on the first interlayer insulating layer ILD1. The second interlayer insulating layer ILD2 may include a silicon compound, a metal oxide, or the like.

The first connection electrode BE1 and the second connection electrode BE2 may be disposed on the second interlayer insulating layer ILD2. The first connection electrode BE1 may be connected to the active layer ACT and the initialization voltage transmission line GSL4 through a contact hole. Through this, the initialization voltage VINT applied to the initialization voltage transmission line GSL4 may be transmitted to the second connection electrode BE2 through the third initialization channel region VI3. The second connection electrode BE2 may be connected to the active layer ACT by a contact hole.

Figure 11:
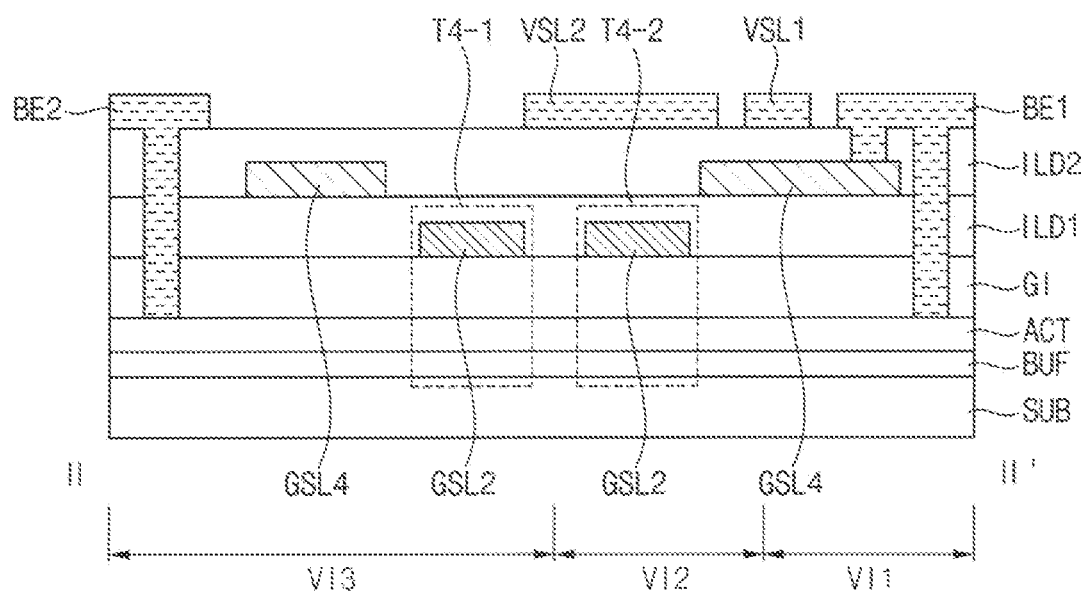
FIG. 11 is a cross-sectional view illustrating a cross-section taken along line II-II' of FIG. 9.

FIG. 11 is a cross-sectional view illustrating a cross-section taken along line II-II' of FIG. 9. The third initialization channel region VI3 and the second initialization channel region VI2 of FIG. 11, and the first initialization channel region VI1 of FIG. 11 may be disposed in different pixel circuit regions.

Referring to FIGS. 9 and 11, the display device may include a substrate SUB, a buffer layer BUF, an active layer ACT, a gate insulating layer GI, an initialization control signal transmission line GSL2, a first interlayer insulating layer ILD1, an initialization voltage transmission line GSL4, a second interlayer insulating layer ILD2, a first connection electrode BE1, a second connection electrode BE2, a data transmission line VSL1, and a power voltage transmission line VSL2.

The substrate SUB may be formed of a transparent or opaque material. The buffer layer BUF may be disposed on the substrate SUB. The active layer ACT may be disposed on the buffer layer BUF. The gate insulating layer GI may be disposed to cover the active layer ACT.

The initialization control signal transmission line GSL2 may be disposed on the gate insulating layer GI. Regions in which the initialization control signal transmission line GSL2 overlaps the active layer ACT may constitute channel regions of transistors T4-1 and T4-2, respectively.

The first interlayer insulating layer ILD1 may cover the initialization control signal transmission line GSL2 and may be disposed on the gate insulating layer GI. The initialization voltage transmission line GSL4 may be disposed on the first interlayer insulating layer ILD1. The initialization voltage VINT of FIG. 2 may be applied to the initialization voltage transmission line GSL4.

The second interlayer insulating layer ILD2 may cover the initialization voltage transmission line GSL4 and may be disposed on the first interlayer insulating layer ILD1.

The first connection electrode BE1, the second connection electrode BE2, the data transmission line VSL1, and the power voltage transmission line VSL2 may be disposed on the second interlayer insulating layer ILD2. The first connection electrode BE1 may be connected to the active layer ACT and the initialization voltage transmission line GSL4 through contact holes exposing the active layer ACT and the initialization voltage transmission line GSL4. Through this, the initialization voltage VINT applied to the initialization voltage transmission line GSL4 may transfer to the second connection electrode BE2 through the second initialization channel region VI2 and the third initialization channel region VI3. The second connection electrode BE2 may be connected to the active layer ACT by a contact hole.

Although FIG. 11 has been described with reference to the second pixel circuit region PXA2 and the third pixel circuit region PXA3, the same may be applied to other pixel circuit regions. For example, the descriptions of FIG. 11 may be equally applied to the first pixel circuit region PXA1 and the second pixel circuit region PXA2. In the present inventive concept, in order to provide the initialization voltage VINT, the initialization voltage VINT may be applied through an extra path even if a defect occurs in contact holes in a region where the contact holes are formed in a limited area.

Figure 12:
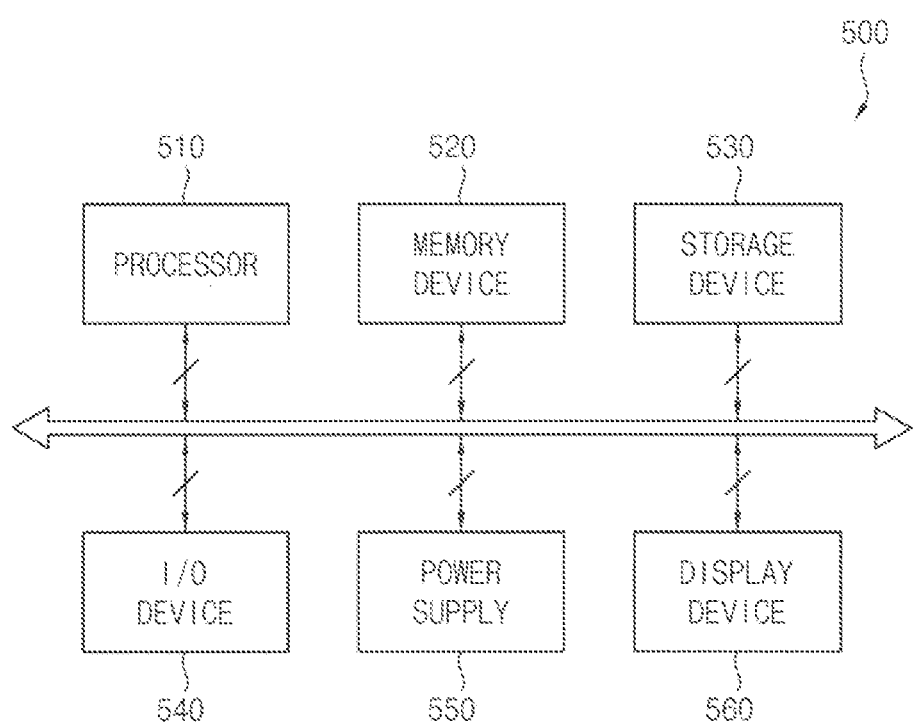
FIG. 12 is a block view illustrating an electronic device according to an embodiment.
Figure 13:
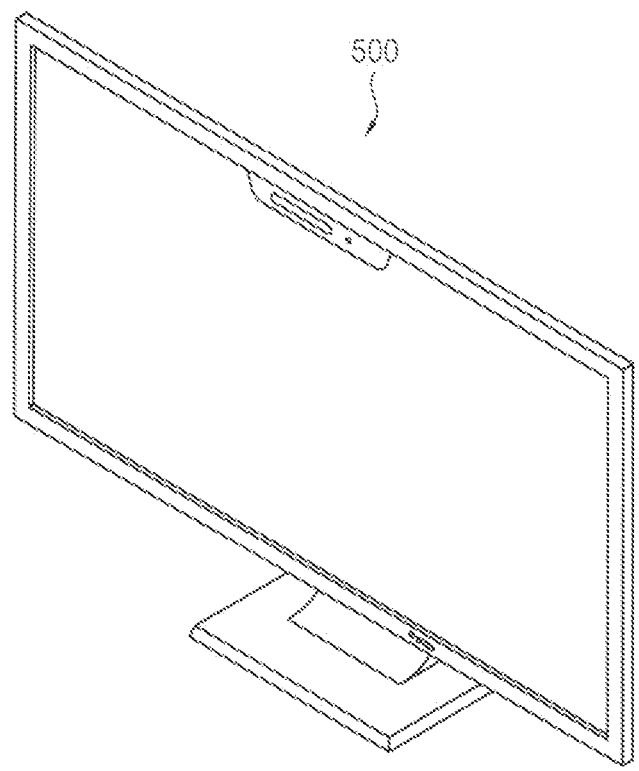
FIG. 13 is a diagram view an example in which the electronic device of FIG. 12 is implemented as a television.
Figure 14:
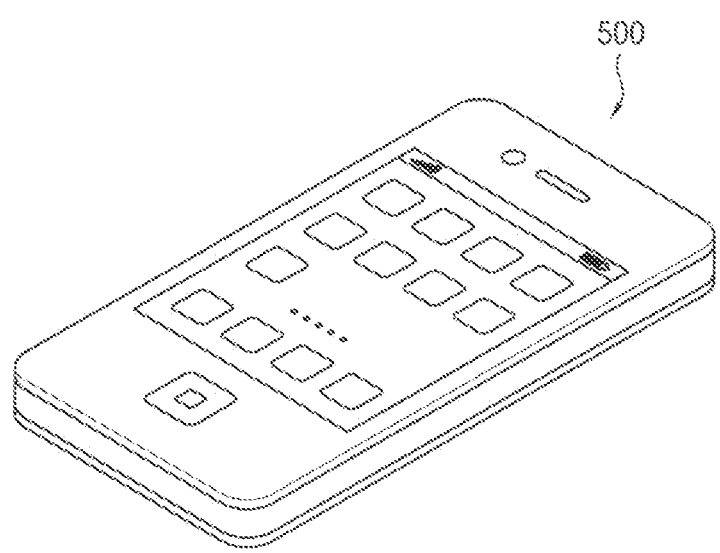
FIG. 14 is a diagram illustrating an example in which the electronic device of FIG. 12 is implemented as a smartphone.

FIG. 12 is a block view illustrating an electronic device according to an embodiment, FIG. 13 is a view an example in which the electronic device of FIG. 12 is implemented as a television, and FIG. 14 is a view illustrating an example in which the electronic device of FIG. 12 is implemented as a smartphone.

Referring to FIGS. 12, 13 and 14, an electronic device DD may include a processor 510, a memory device 520, a storage device 530, an input/output device 540, a power supply 550, and a display device 560. In this case, the display device 560 may correspond to the display device described with reference to the aforementioned drawings. The electronic device DD may further include several ports capable of communicating with a video card, a sound card, a memory card, a USB device, and the like. In an embodiment, as illustrated in FIG. 13, the electronic device DD may be implemented as a television. In another embodiment, as illustrated in FIG. 14, the electronic device DD may be implemented as a smartphone. However, the electronic device DD is not limited thereto, and for example, the electronic device DD includes a mobile phone, a video phone, a smart pad, a smart watch, a tablet PC, a vehicle navigation system, It may be implemented as a computer monitor, notebook computer, head mounted display (HMD), or the like.

The processor 510 may perform specific calculations or tasks. In an embodiment, the processor 510 may be a microprocessor, a central processing unit (CPU), an application processor (AP), or the like. The processor 510 may be connected to other components through an address bus, a control bus, a data bus, or the like. In an embodiment, the processor 510 may also be connected to an expansion bus such as a peripheral component interconnect (PCI) bus.

The memory device 520 may store data necessary for the operation of the electronic device DD. For example, the memory device 520 may include nonvolatile memory device such as an erasable programmable read-only memory (EPROM) device, an electrically erasable programmable read-only memory (EEPROM) device, a flash memory device, and a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and/or volatile memory device such as a dynamic random access memory (DRAM) device, a static random access memory (SRAM) device, a mobile DRAM device.

The storage device 530 may include a solid state drive (SSD), a hard disk drive (HDD), a CD-ROM, or the like. The input/output device 540 may include an input means such as a keyboard, a keypad, a touch pad, a touch screen, and a mouse, and an output means such as a speaker and a printer.

The display device according to the embodiments may be applied to a display device included in a computer, a notebook, a mobile phone, a smartphone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit of the disclosure. Accordingly, the scope of the disclosure should not be limited by the disclosed embodiments, but rather should be interpreted in accordance with the following claims including their equivalents.

What is claimed is:

1. A display device, comprising:
  a plurality of pixel circuits disposed adjacent to each other, the plurality of pixel circuits including a plurality of active patterns disposed to correspond to the pixel circuits, respectively,
  wherein each of the active patterns includes a first initialization channel region to through which an initialization voltage is transferred, a second initialization channel region through which the initialization voltage is transferred, and a third initialization channel region through which the initialization voltage is transferred, a first end region of the third initialization channel region being connected between the first initialization channel region and the second initialization channel region, and
  wherein a second initialization channel region in a first pixel circuit is directly connected to a first initialization channel region of a second pixel circuit disposed adjacent to the first pixel circuit.

2. The display device of claim 1, wherein the plurality of pixel circuits are arranged along a plurality of pixel rows extending in a first direction and a plurality of pixel columns extending in a second direction crossing the first direction, the active patterns corresponding to one pixel row are connected to each other, and the active patterns corresponding to one pixel column are connected to each other.

3. The display device of claim 1, wherein the each of the active patterns further includes an initialization control signal transmission line extending in one direction and disposed on the active patterns, and
  wherein the initialization control signal transmission line overlaps a part of the first initialization channel region, a part of the second initialization channel region, and a part of the third initialization channel region.

4. The display device of claim 3, wherein the each of the active patterns further includes an initialization voltage transmission region connected to a second end region opposite to the first end region of the third initialization channel region.

5. The display device of claim 4, wherein the each of the active patterns further includes a driving channel region through which driving current corresponding to a data signal flows, and
  wherein the display device further includes a driving gate electrode disposed on the driving channel region of the active pattern to overlap the driving channel region and applying the initialization voltage.

6. The display device of claim 5, the each of the active patterns further includes a connection electrode disposed on the initialization voltage transmission region and the driving gate electrode, and connecting the initialization voltage transmission region and the driving gate electrode.

7. The display device of claim 5, wherein each of the plurality of pixel circuits includes a capacitor electrode disposed on the driving gate electrode, and wherein a power voltage is applied to the capacitor electrode.

8. The display device of claim 1, wherein the each of the active patterns further includes an initialization voltage transmission line extending in one direction, applying the initialization voltage, and disposed on the active patterns, and
  wherein the initialization voltage transmission line overlaps a part of the first initialization channel region.

9. The display device of claim 8, wherein the first pixel circuit and the second pixel circuit disposed adjacent to each other along the one direction.

10. The display device of claim 9, wherein the initialization voltage is applied from the initialization voltage transmission line to the first initialization channel region of the first pixel circuit, and
  wherein a second initialization channel region of the first pixel circuit receives the initialization voltage from the first initialization channel region of the second pixel circuit.

11. The display device of claim 8, wherein each of the plurality of pixel circuits further includes a connection electrode disposed on the initialization voltage transmission line, and
  wherein the connection electrode connects the initialization voltage transmission line and the first initialization channel region of the active pattern.

12. The display device, comprising:
  a first pixel circuit; and
  a second pixel circuit disposed adjacent to the first pixel circuit along a first direction and connected to the first pixel circuit,
  wherein the first pixel circuit includes a first active pattern, the first active pattern including a first initialization channel region through which an initialization voltage is transferred, and a second initialization channel region through which the initialization voltage is transferred,
  wherein the second pixel circuit includes a second active pattern, the second active pattern including a third initialization channel region through which the initialization voltage is transferred and a fourth initialization channel region through which the initialization voltage is transferred, and
  wherein the third initialization channel region is directly connected to the second initialization channel region and the initialization voltage is transferred from the third initialization channel region to the second initialization channel region.

13. The display device of claim 12, further comprising:
  a third pixel circuit disposed adjacent to the first pixel circuit along a second direction crossing to the first direction and electrically connected to the first pixel circuit,
  wherein the third pixel circuit includes a third active pattern connected to the first active pattern.

14. The display device of claim 12, wherein each of the first pixel circuit and the second pixel circuit further includes an initialization control signal transmission line extending in the first direction, applying a gate signal, and disposed on the first active pattern and the second active pattern, and
- wherein the initialization control signal transmission line overlaps the first to third initialization channel regions.

15. The display device of claim 14,
- wherein the first active pattern includes a fifth initialization channel region connected between the first initialization channel region and the second initialization channel region, and a first initialization voltage transmission region connected to the fifth initialization channel region,
- wherein the second active pattern includes a sixth initialization channel region connected between the third initialization channel region and the fourth initialization channel region, and a second initialization voltage transmission region connected to the sixth initialization channel region, and
- wherein the initialization control signal transmission line overlaps a part of the fifth initialization channel region and a part of the sixth initialization channel region.

16. The display device of claim 15,
- wherein the first active pattern includes a first driving channel region through which driving current corresponding to a first data signal flows and the second active pattern includes a second driving channel region through which driving current corresponding to a second data signal flows, and
- wherein the display device further includes a first driving gate electrode disposed on the first driving channel region, overlapping the first driving channel region, and applying the initialization voltage, and a second driving gate electrode disposed on the second driving channel region, overlapping the second driving channel region, and applying the initialization voltage.

17. The display device of claim 16, wherein the each of the first pixel circuit and the second pixel circuit further includes a first connection electrode disposed on the first initialization voltage transmission region and the first driving gate electrode, and connecting the first initialization voltage transmission region and the first driving gate electrode, and a second connection electrode disposed on the second initialization voltage transmission region and the second driving gate electrode, and connecting the second initialization voltage transmission region and the second driving gate electrode.

18. The display device of claim 16, wherein the each of the first pixel circuit and the second pixel circuit further includes a capacitor electrode disposed on the each of the first driving gate electrode and the second driving gate electrode and applying a power voltage.

19. The display device of claim 12, further comprising:
- an initialization voltage transmission line extending along a first direction, applying the initialization voltage, and disposed on the first active pattern and the second active pattern,
- wherein the initialization voltage transmission line overlaps a part of the first initialization channel region and a part of the third initialization channel region.

20. The display device of claim 19,
- wherein the initialization voltage is applied to the first initialization channel region from the initialization voltage transmission line, and
- wherein the second initialization channel region transfers the initialization voltage from the third initialization channel region.

21. The display device of claim 20, wherein the each of the first pixel circuit and the second pixel circuit further includes a first connection electrode disposed on the initialization voltage transmission line and connecting the initialization voltage transmission line and the first initialization channel region, and a second connection electrode disposed on the initialization voltage transmission line and connecting the initialization voltage transmission line and the third initialization channel region.

* * * * *